(12) United States Patent
Erdmann

(10) Patent No.: US 9,351,406 B2
(45) Date of Patent: May 24, 2016

(54) STENCIL FOIL ASSEMBLY

(71) Applicant: QTS Engineering, Inc., Medway, MA (US)

(72) Inventor: Thomas G. Erdmann, East Walpole, MA (US)

(73) Assignee: QTS ENGINEERING, INC., Medway, MA (US)

( * ) Notice: Subject to any disclaimer, the term of this patent is extended or adjusted under 35 U.S.C. 154(b) by 0 days.

(21) Appl. No.: 14/569,435

(22) Filed: Dec. 12, 2014

(65) Prior Publication Data

US 2015/0165757 A1    Jun. 18, 2015

Related U.S. Application Data

(60) Provisional application No. 61/916,972, filed on Dec. 17, 2013.

(51) Int. Cl.
*B41F 15/36* (2006.01)
*H05K 3/12* (2006.01)
*B41L 13/02* (2006.01)

(52) U.S. Cl.
CPC *H05K 3/12* (2013.01); *B41F 15/36* (2013.01); *B41L 13/02* (2013.01)

(58) Field of Classification Search
CPC .......... B41F 15/36; B41F 15/34; B41F 15/38; B41F 15/00; H05K 3/12; B41L 13/02; B41L 13/00; B41L 13/12; B05C 17/08; B05C 17/06; B41N 1/24
See application file for complete search history.

(56) References Cited

U.S. PATENT DOCUMENTS

| | | | |
|---|---|---|---|
| 3,541,957 A | 11/1970 | Bubley | |
| 5,347,925 A * | 9/1994 | Holderegger | 101/127 |
| 5,390,397 A * | 2/1995 | Kremer et al. | 24/662 |
| 5,606,911 A * | 3/1997 | Cane | 101/127 |
| 5,971,790 A * | 10/1999 | Rohde | 439/357 |
| 6,119,592 A | 9/2000 | Nishikawa et al. | |
| 6,331,223 B1 * | 12/2001 | Wylie et al. | 156/160 |
| 6,494,134 B2 | 12/2002 | Erdmann | |
| 6,698,349 B2 | 3/2004 | Komata | |
| 6,990,900 B2 | 1/2006 | Anderson | |
| 8,069,783 B2 | 12/2011 | Hall et al. | |

(Continued)

FOREIGN PATENT DOCUMENTS

EP    0650832 A1    5/1995
EP    1308275 A1    5/2003

OTHER PUBLICATIONS

Lu-Con Technologies, LLC, 2 Plymouth Court, Flemington, NJ 08822, "Equi-Foil", Mar. 15, 2013.

*Primary Examiner* — David Banh
(74) *Attorney, Agent, or Firm* — Barlow, Josephs & Holmes, Ltd.

(57) ABSTRACT

A stencil assembly includes a stencil foil, having a stencil pattern thereon and of a planar configuration, with a peripheral edge, which is a captured by rigid frame. The rigid frame includes a base and a cover attached thereto. The assembly adapts a standard stencil foil for use in a stretch frame that requires an elongated groove. The assembly thereby facilitates mounting the stencil to a stretching machine during printing. Also, the stencil assembly protects a user from injury by preventing contact with the sharp outer edges of the stencil foil. Further, the assembly protects the stencil foil portion from damage and greatly facilitates handling thereof.

10 Claims, 20 Drawing Sheets

(56) References Cited

U.S. PATENT DOCUMENTS

| | | |
|---|---|---|
| 8,276,803 B1 | 10/2012 | Chang et al. |
| 8,342,089 B2 | 1/2013 | Cane et al. |
| 8,490,545 B2 | 7/2013 | Hall et al. |
| 8,904,929 B2 | 12/2014 | Hall et al. |
| 2002/0148370 A1* | 10/2002 | Erdmann .................. 101/127.1 |
| 2003/0057426 A1* | 3/2003 | Miyazaki et al. ............... 257/88 |
| 2004/0025722 A1* | 2/2004 | Goss ............................ 101/129 |
| 2006/0005721 A1* | 1/2006 | Hall et al. .................. 101/127.1 |
| 2006/0021527 A1* | 2/2006 | Zepic et al. ................... 101/114 |
| 2008/0022869 A1* | 1/2008 | Dobie ........................ 101/128.1 |
| 2009/0151578 A1* | 6/2009 | Kleinschnitz et al. ..... 101/128.4 |
| 2012/0227597 A1* | 9/2012 | Meeus et al. .................. 101/126 |
| 2013/0068822 A1 | 3/2013 | Chang et al. |

\* cited by examiner

STENCIL FOIL ASSEMBLY

CROSS REFERENCE TO RELATED APPLICATION

This application is related to and claims priority to earlier filed U.S. provisional patent application 61/916,972, filed Dec. 17, 2013, and the entire contents thereof is incorporated herein by reference.

BACKGROUND OF THE INVENTION

The present invention relates generally to the manufacture of circuit boards and pertains, more specifically, to the placement of pads of solder paste in a prescribed pattern on a printed circuit board being prepared for the surface mounting of components onto the circuit board by subsequent soldering.

Current manufacturing techniques for making printed circuit boards call for the mounting of components to the circuit board by "surface mounting". That is, rather than passing the leads of a component through holes in a circuit board and then soldering the leads at the holes, the circuit board is provided with pads of solder paste and the components are placed on the pads for soldering directly to the surface of the board.

In order to place the pads of paste in appropriate locations on the circuit board, just before affixing the components to the board, a stencil-like screen or foil is juxtaposed with the circuit board and provides a pattern of openings registered with the locations where the pads are to be placed. The paste then is spread over the screen with a squeegee to lay down the pattern of pads. The stencil screen is in the form of a thin foil, which is supported by a stretcher frame in an appropriately tensioned state. The frame fits into a machine, which registers the tensioned screen with the circuit board and then applies the paste. Typically, the machine also stretches the stencil foil to achieve the desired tension of the stencil to ensure accuracy during printing.

However, the foregoing stencils pose serious safety and operational problems and are difficult to securely mount to a stretcher apparatus. For example, traditional foil stencils are potential safety hazards to those technicians that handle them due to the presence of sharp edges around the entire periphery of the foil stencil. Such sharp edges can easily cut a person handling the foil stencil and putting them at risk of exposure to infection. This is a particular concern due to the presence of solder paste, which can be toxic, in the work environment. In light of the aforementioned safety hazards, transportation and storage of foil stencils are problematic because technicians are constantly transporting foil stencils to and from a storage location during the normal course of circuit board manufacture. During this normal handling, the foil stencil undergoes bending, for example, that threatens its integrity. As a result, foil stencils are prone to damage.

There have been many attempts in the prior art to address the foregoing problems with foil stencils relating to safety to the handler and damage during handling and storage. For example, it is common in the prior art to mount foil stencils to an aluminum frame with a polyester border to ensure proper tensioning of the foil stencil. While the encapsulation of the periphery of the foil stencil with polyester keeps the foil tight and covers the sharp edges from the handler, it is time consuming and expensive to encapsulate the foil stencil and requires special molding machinery. As a result, such polyester encapsulated foil stencils require an additional preparation step, which typically requires outsourcing to a special subcontractor for such operation. Moreover, these encapsulated foil stencils are difficult to store and cannot be easily retrieved when stacked.

FIG. 1 shows a prior art stencil foil assembly 10 that has a frame 12 on which a stencil foil 14 can be supported. Mounting apertures 16 on the stencil foil 14 are spaced apart and arranged to engage an array of studs 18 that extend upwardly on the frame 12 when the stencil foil 14 is placed on the frame 12. The frame 12 engages a stretching machine (not shown), so that stretching of the frame 12 pulls the stencil foil 14 into tension. A stencil pattern 20 is shown towards the center of the stencil foil of FIG. 1.

In view of the foregoing, there is a demand for a frame for a foil stencil assembly that protects that handler from the sharp edges to avoid injury. There is a further demand for a foil stencil assembly that can be easily stored and retrieved. There is a demand for a foil stencil assembly that can lay flat or hang from a vertical hook in a high density storage cabinet. There is a further demand for a foil stencil assembly that is inexpensive and easy to assemble without special tools or special equipment. There is also a demand for a foil stencil assembly that has stencil tension that does not decrease over time and is machine washable. In addition, there is a further demand for a foil stencil assembly with a large print area.

Also, in the prior art, there is need to facilitate adapting a stencil foil for mounting thereof to a stretcher frame. It is known in the art to bend the peripheral edges of the stencil foil so such periphery can be gripped and secured by a stretching apparatus. However, this requires that a custom stencil frame be created to provide such bent free edges. Moreover, these bent edges are difficult to form and can easily break.

Therefore, there is a need for a stencil foil assembly that can be easily affixed to existing and standard stencil foils to provide a rigid frame for securing the entire assembly into a stretching apparatus for printing.

SUMMARY OF THE INVENTION

The present invention preserves the advantages of prior art stencil foil assemblies for the surface mount solder paste stencil printing industry. In addition, it provides new advantages not found in currently available assemblies and overcomes many disadvantages of such currently available assemblies.

The present invention preserves the advantages of prior art stencil foil assemblies for the surface mount solder paste stencil printing industry. In addition, it provides new advantages not found in currently available assemblies and overcomes many disadvantages of such currently available assemblies.

The invention is generally directed to a stencil foil assembly includes a stencil foil, having a stencil pattern thereon, of a planar configuration. The assembly also includes a rigid frame with a base and a cover.

Generally, a stencil foil assembly kit for holding a stencil foil has a base, a cover, and an engagement member. The base has a top surface that provides an upper surface for supporting a peripheral portion of a stencil foil. A plurality of apertures are defined along the top surface of the base, and a plurality of apertures are defined along the peripheral edge of the stencil foil. The apertures on the base are spaced to each be in alignment with one of the stencil apertures when the stencil is supported on the base.

The cover has a main body that has a lower surface for engaging a stencil. A plurality of snap posts extend from the main body, and are each configured to be respectively routed through the stencil apertures and to be in secured engagement with the base apertures, thereby sandwiching a peripheral portion of the stencil foil between the top surface of the base and the lower surface of the cover.

An engagement member is secured to (or formed integrally on) the cover, the base, or both the cover and the base. The engagement member is configured to engage a stretch frame apparatus.

A manufacturer provides a user with components described herein for forming a stencil foil assembly for protecting and supporting a stencil foil. In the preferred embodiment, the assembly includes a set of base members and a set of cover members. In the preferred embodiment, there are four congruent base members for forming a base and four congruent cover members for forming a cover. The user assembles the base members to form a base, which is configured to extend around the peripheral edge of a stencil foil. In the preferred embodiment, the stencil foil has a substantially square peripheral edge when viewed from above, and the base members form a base that is substantially square when viewed from above. The user then places the stencil foil onto the assembled base, so the peripheral edge of the stencil foil is supported on an upper surface of the base. Finally, the user places the cover members over the stencil, so the peripheral edges of the stencil are sandwiched between the cover and the base. In particular, each of the four sides of the square stencil foil is secured between a respective mating pair of a base member and a cover member.

The assembly further includes an engagement member for engaging a stretch frame apparatus, which is typically provided to the user separately from the stencil frame of the present invention. The engagement member can be formed integrally with the cover member, or can be formed by formations on the cover member and the base member. Although not shown herein, the engagement member could also be formed integrally with the base member.

In the preferred embodiment, the engagement member is integrally formed with the cover. Each cover member has an inwardly sloped cover grip surface that is formed adjacent the lower surface of the cover. Together, these inwardly sloped cover grip surfaces form the engagement member.

The base members are congruent, and each base member has a male post located at the first end of the base member and a female socket defined in the female socket housing at the second end of the base member. When the base members are brought together to form a base, the male post of one base member is received in the female socket of an adjacent base member.

The lower surface of the male post and the upper surface of the male post are configured and arranged to be in facing engagement with a lower female socket surface and an upper female socket surface, respectively, when the male post is received in the female socket of an adjacent base member. This provides a snug, friction fit between the respective male post and the respective female socket of adjacent base members.

The side surfaces of the post are in facing relation with side surface of the female socket, but there is a gap between the sides of the post and the sides of the socket in the preferred embodiment.

The male post extends longitudinally along the axis of the base member and in a horizontal direction from a male post platform on the base member. The female socket is formed in a female socket housing.

In the preferred embodiment, each cover member is dimensioned and configured to extend between the male post platform and the female socket housing on its respective base member.

In the first embodiment, each cover member is secured to each respective base member by snap posts. Each snap post includes a substantially cylindrical post wall with a tapered latching formation at its lower end. The latching formation has an annular latching face. Each base member has apertures for respectively receiving the snap posts. Each base aperture has an annular post retention face extending between an annular base aperture wall and a recessed annular wall. The annular post retention face is configured to engage the annular latching face of a respective snap post for retaining the respective snap post within the aperture.

When the base members are assembled, and when the cover members are secured to their respective base members, an outer peripheral edge of the assembly is defined by the outer peripheral edge of the female socket housing and the outer peripheral edge of the cover members. The outer peripheral edge of the assembly allows a user to easily, safely, and comfortably grip the assembly.

In a second embodiment, the base has a generally L-shaped profile with an upstanding wall and a support flange emanating inwardly from the upstanding wall. The stencil foil resides on the support flange with the bottom surface of the periphery of the stencil foil being in communication with the top surface of said support flange. The outer edge of the stencil foil is positioned adjacent to the inner surface of said upstanding wall. The periphery of the stencil foil is secured to the rigid frame. The stencil foil assembly protects a user from injury by preventing contact with the sharp outer edges of the stencil foil and also provides a structure for interconnecting the assembly to a stretch frame for printing. The assembly protects the stencil foil portion from damage, maintains it in a tensioned condition and greatly facilitates handling thereof.

The stencil foil is secured to the support flange of the outer rigid frame by use of a snap-on cover. The cover includes downwardly depending studs that engage female apertures in the stencil and corresponding apertures in the base. When the base and cover are installed on the periphery of the stencil foil, the edge of the stencil foil is protected and a structure is provided so that the entire stencil foil assembly can be secured to a stretching frame.

It is therefore an object of the present to provide a stencil foil assembly that protects the user from injury from sharp edges during handling of the foil.

Another object of the present invention is to provide a stencil foil assembly that protects the stencil foil from damage during shipping and handling.

There is another object of the present invention to provide an outer frame to facilitate interconnection of a stencil foil to a stretch frame.

It is a further object of the present invention to provide a stencil foil assembly that is inexpensive and easy to manufacture and assemble.

Another object of the present invention is to provide a stencil foil assembly that reduces setup time and the need for tools for such setup.

Yet a further object of the invention is to enable a standard stencil to be easily and quickly modified for use in a stretch frame.

BRIEF DESCRIPTION OF THE DRAWINGS

The novel features which are characteristic of the present invention are set forth in the appended claims. However, the invention's preferred embodiments, together with further objects and attendant advantages, will be best understood by reference to the following detailed description taken in connection with the accompanying drawings in which:

DETAILED DESCRIPTION OF THE PREFERRED EMBODIMENT

Figure 1:
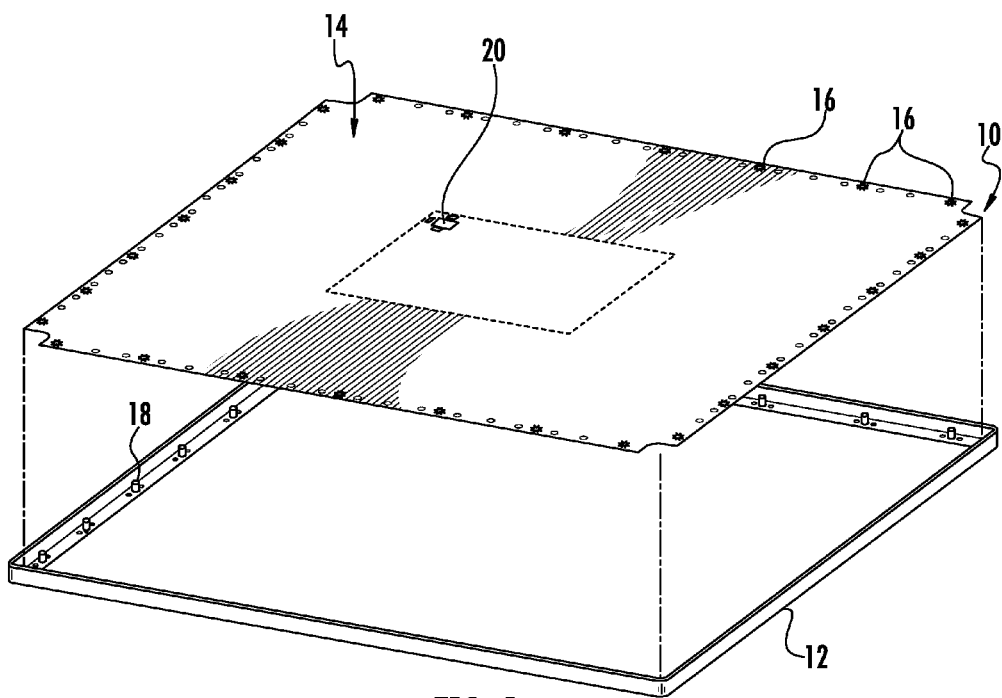
FIG. 1 is a perspective view of a stencil foil assembly of the prior art.
Figure 2:
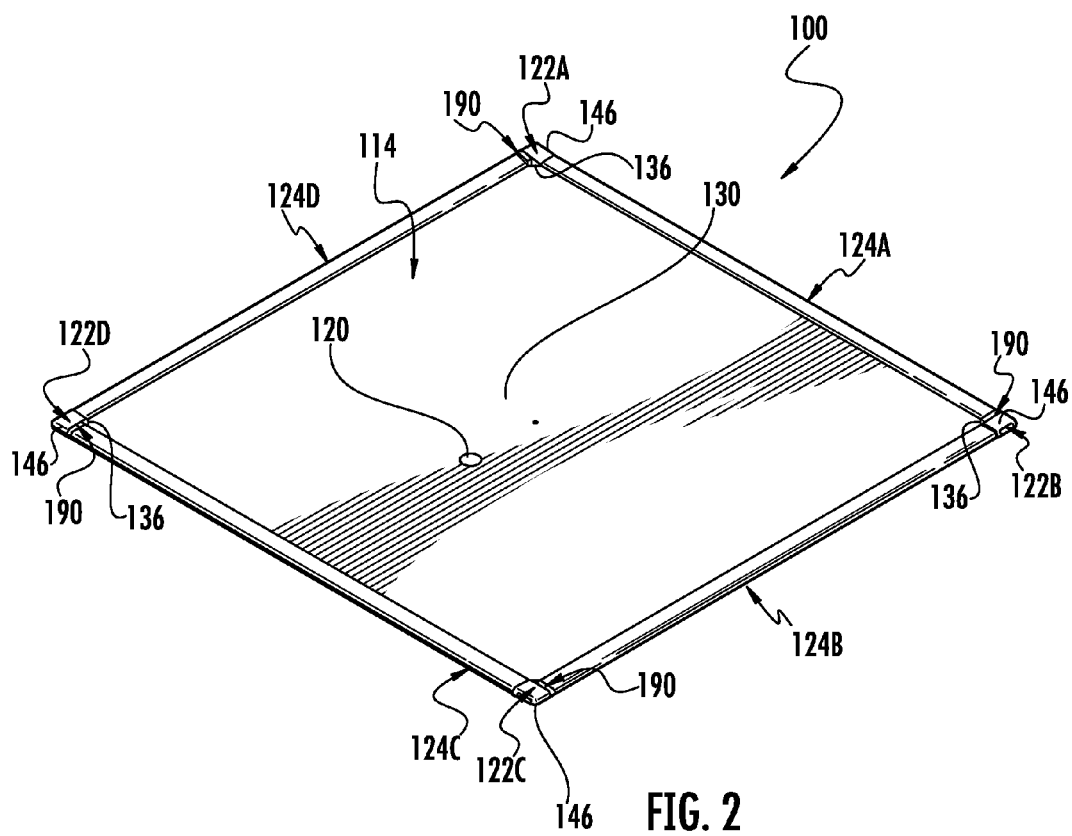
FIG. 2 is a perspective view of the preferred embodiment of the stencil foil assembly of the present invention.

The stencil foil of the present invention is shown generally in FIGS. 2-22B. Referring to FIG. 2, the preferred embodiment of the stencil foil assembly 100 is shown in fully assembled form and ready for use. The stencil foil assembly has a stencil foil 114 with a stencil pattern 120 defined thereon, and the stencil foil 114 is supported by four base members 122A-D and four cover members 124A-D that extend along and grip the peripheral portions (or peripheral edges) 128A-D of the stencil foil 114. The base members 122A-D and cover members 124A-D are described in more detail herein, and substantially make up the frame of the stencil foil assembly 100. The stencil foil 114 can be provided to a user separately from the base members 122A-D and the cover members 124A-D of the present invention, or it can be provided to a user with the base members and the cover members of the present invention.

Figure 3:
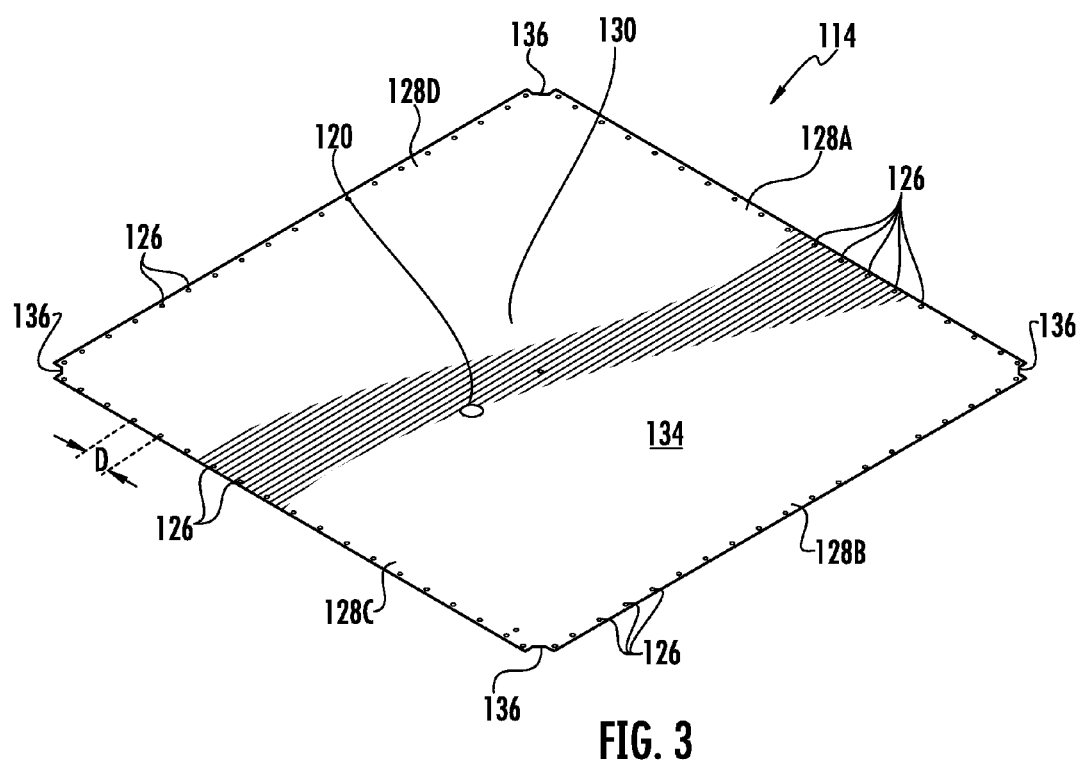
FIG. 3 is a perspective view of a stencil foil that is supported in the stencil foil assembly of FIG. 2.

As shown in FIGS. 2 and 3, in the preferred embodiment, the stencil foil assembly is useful for supporting a substantially square stencil foil 114. The stencil foil 114 is dimensioned and configured to extend over a circuit board (not shown), and the lower surface 132 of the stencil foil 114 can be positioned in facing engagement with an upper surface of a circuit board (not shown). The pattern 120 is defined in a central region 130 of the stencil foil 114, so that when a paste is spread over the upper surface 134 of the stencil foil 114, a user can cause the paste to fill the space defined by the pattern 120. The pattern is shown in FIGS. 2 and 3 as a circular pattern by way of example, however other patterns are within the scope of the present invention. The thickness of the stencil foil 114 in the region of the pattern 120 is configured so that the desired thickness of the paste is disposed on the circuit board through this process. When viewed from above, the stencil foil 114 has four main sides along peripheral edge regions 128A-D. The stencil foil 114 shown in the figures has chamfered corners 136. The four main sides together form the peripheral edge of the stencil foil 114.

As described herein, a user can pull the stencil foil 114 into a desired tension by using the base and cover of the assembly to pull the peripheral edge regions 128A-D of the stencil foil away from the center region 130 of the stencil foil. To facilitate gripping of the peripheral edges 128A-D of the stencil foil 114 by the assembly of the present invention, a plurality of apertures 126 are defined along the peripheral edges 128A-D of the stencil foil 114. Preferably the apertures 126 are substantially evenly spaced apart by a distance D near the peripheral edge. The stencil apertures 126 are preferably cylindrical openings defined within a cylindrical stencil aperture wall 138. These stencil apertures 126 are engaged by the respective mating cover members and base members of the assembly of the present invention, as described in more detail below, particularly in relation to FIG. 15. It can be seen that the peripheral edge portions 128A-D of the stencil foil 114, shown in FIG. 3, are captured by a base and cover construction in FIG. 2.

Figure 4:
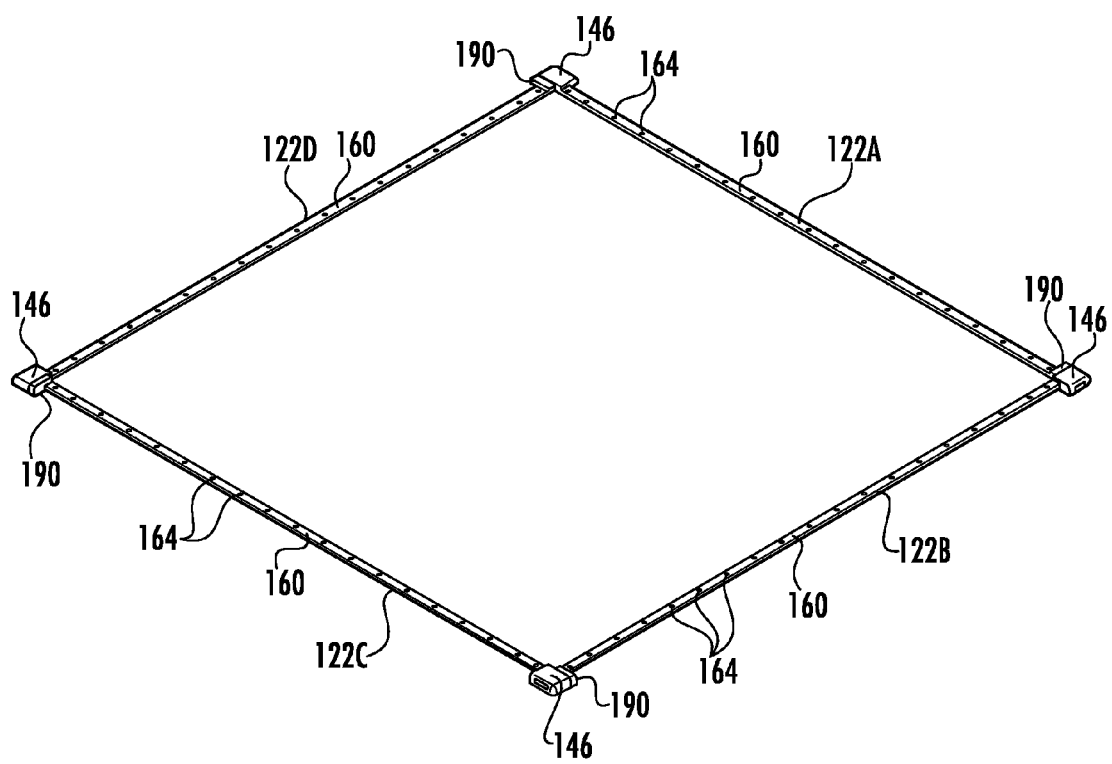
FIG. 4 is a perspective view of the base of the stencil foil assembly of FIG. 2.
Figure 5:
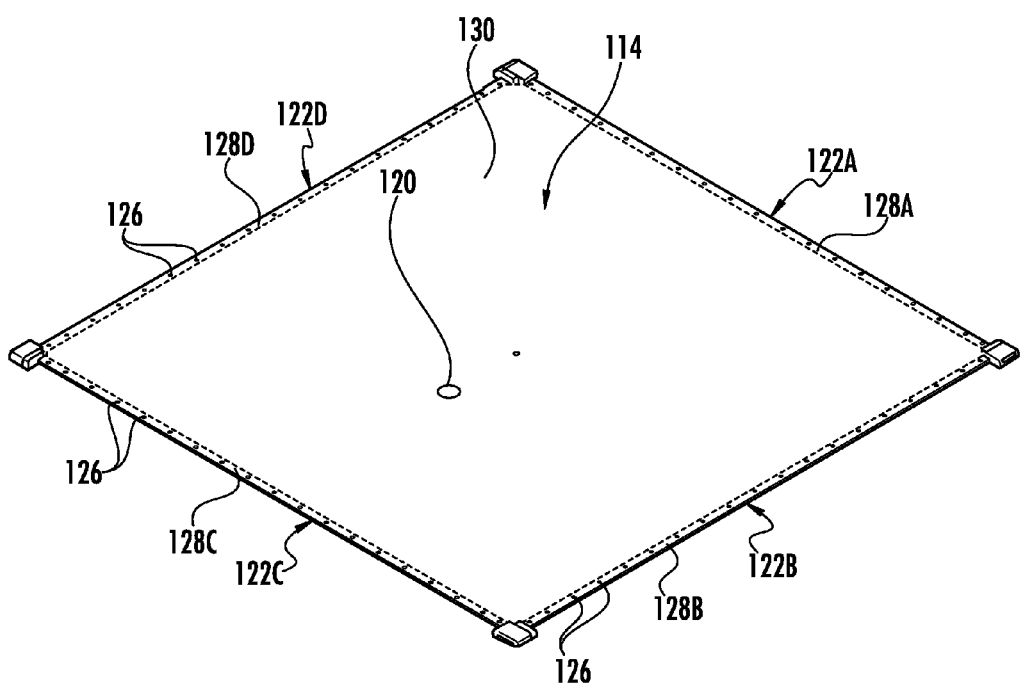
FIG. 5 is a perspective view of the base of FIG. 4 with a stencil foil placed thereon.

To secure the stencil foil 114 to the frame, the user first assembles the base. FIG. 4 shows a base of the frame assembled of base members 122A-D, and FIG. 5 shows a stencil foil 114 extending over the base members 122A-D before the stencil has been secured over the base by the cover members 124A-D. In the preferred embodiment of the present invention, there are four base members 122A-D that substantially form a square base, and there are four cover member 124A-D, shown in FIG. 2, that are received respectively on the four base members 122A-D. The four cover members 124A-D are collectively referred to herein as the cover, though the cover members 124A-D are not connected directly to each other in the preferred embodiment. Thus, the stencil foil assembly 100 includes four mating pairs composed of a cover member and a base member, and the stencil foil 114 has a peripheral edge that is secured between each respective pair of a cover member and a base member.

Figure 6:
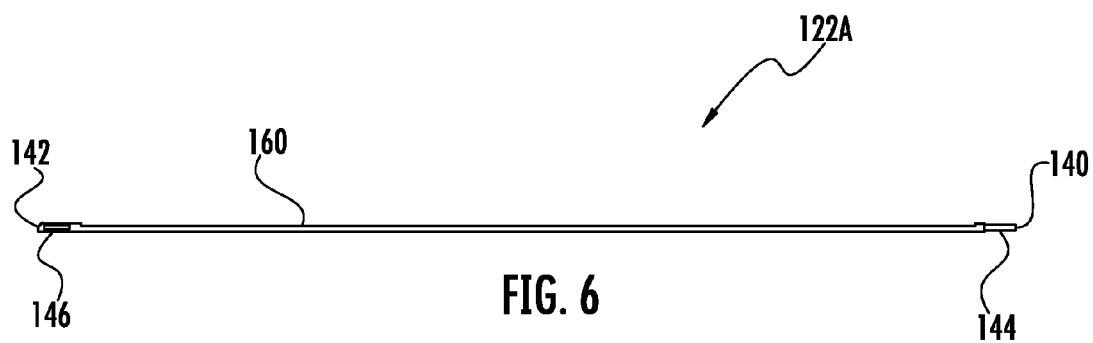
FIG. 6 is a side view of a base member for constructing the base of the preferred embodiment.

The four base members 122A-D are substantially congruent, so that a user can arrange the four base members 122A-D in any order to form a square as shown in FIG. 4, with the upper surfaces of the base members 122A-D facing in substantially the same direction. As shown in FIG. 6, each base member has a first end 140 and a second end 142, with a male post 144 located at the first end 140, and a female socket 146 located at the second end 142. When the base members 122A-D are fully assembled to form a base, the post 144 of a first base member 122A is received in the female socket 146 of a second base member 122B; the post 144 of the second base member 122B is received in the female socket 146 of a third base member 122C; the post 144 of the third base member 122C is received in the female socket 146 of a fourth base member 122D; and the post 144 of the fourth base member 122D is received in the female socket 146 of the first base member 122A.

Where there are more base members, such as may be the case in embodiments where the stencil 114 is in the form of a hexagon, a triangle, or another shape that is not substantially square, the base members are arranged and configured in a similar fashion, with male posts of each base member being received in a female socket of an adjacent base member.

Figure 7:
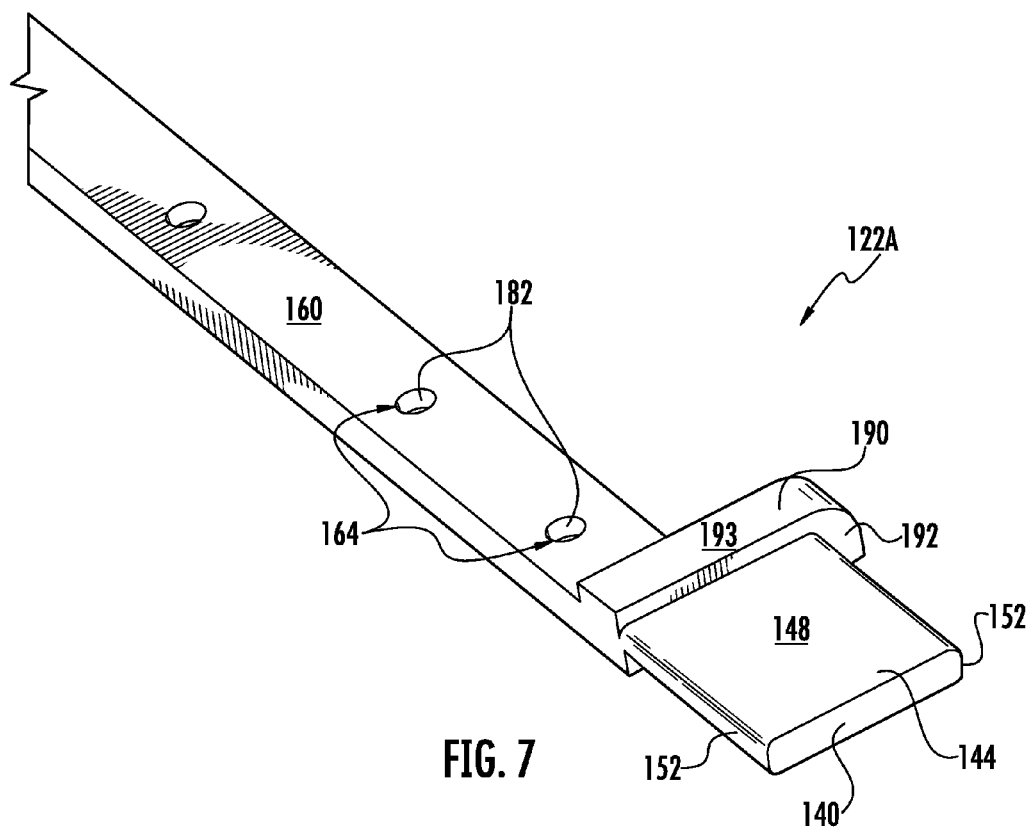
FIG. 7 is a perspective view of a first end of the base member of FIG. 6.
Figure 8:
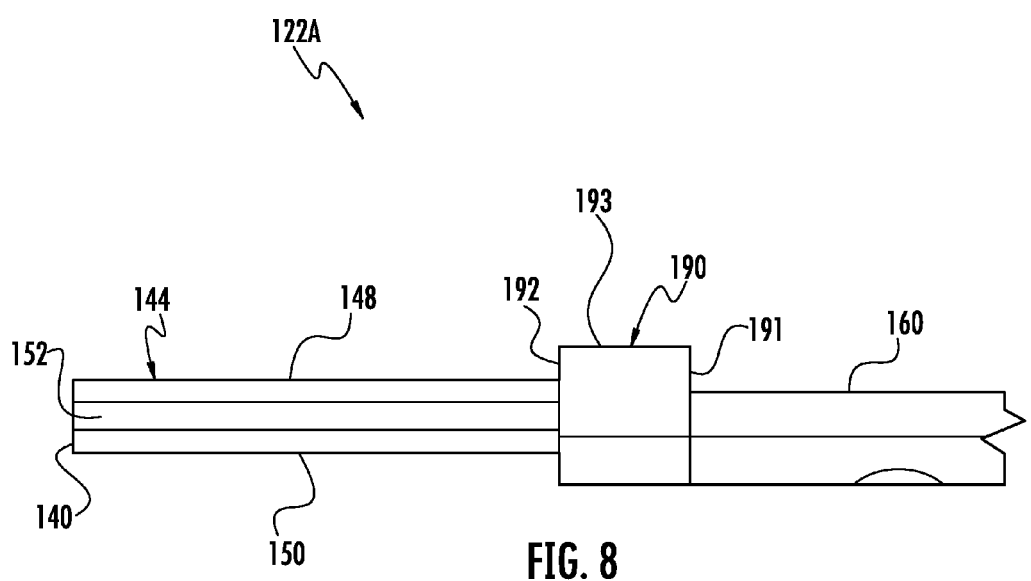
FIG. 8 is a side view thereof.
Figure 9:
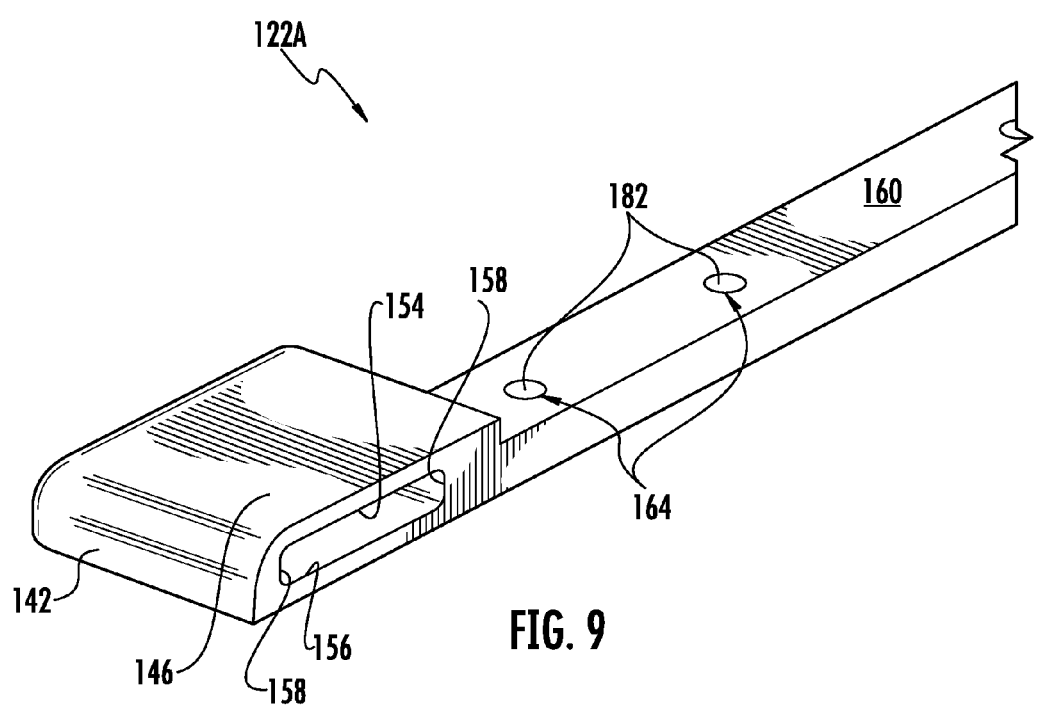
FIG. 9 is a perspective view of a second end of the base member of FIG. 6.
Figure 10:
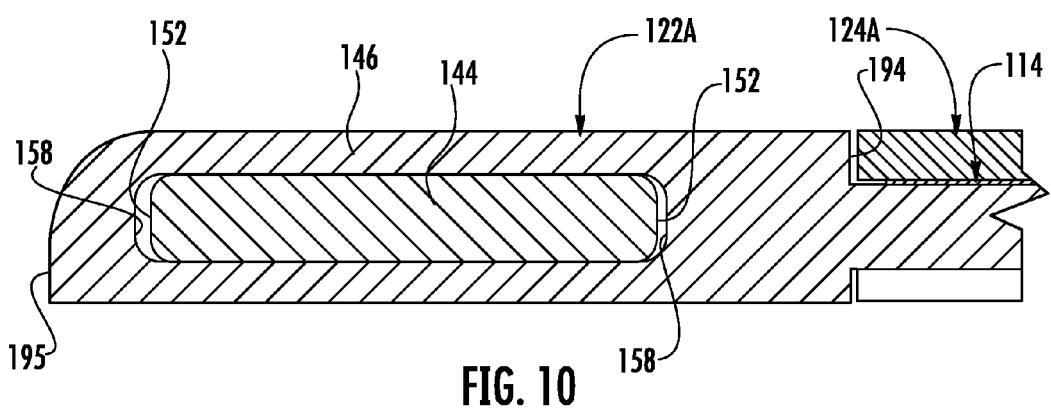
FIG. 10 is a cross sectional view through a male post and female socket of FIG. 2.
Figure 11:
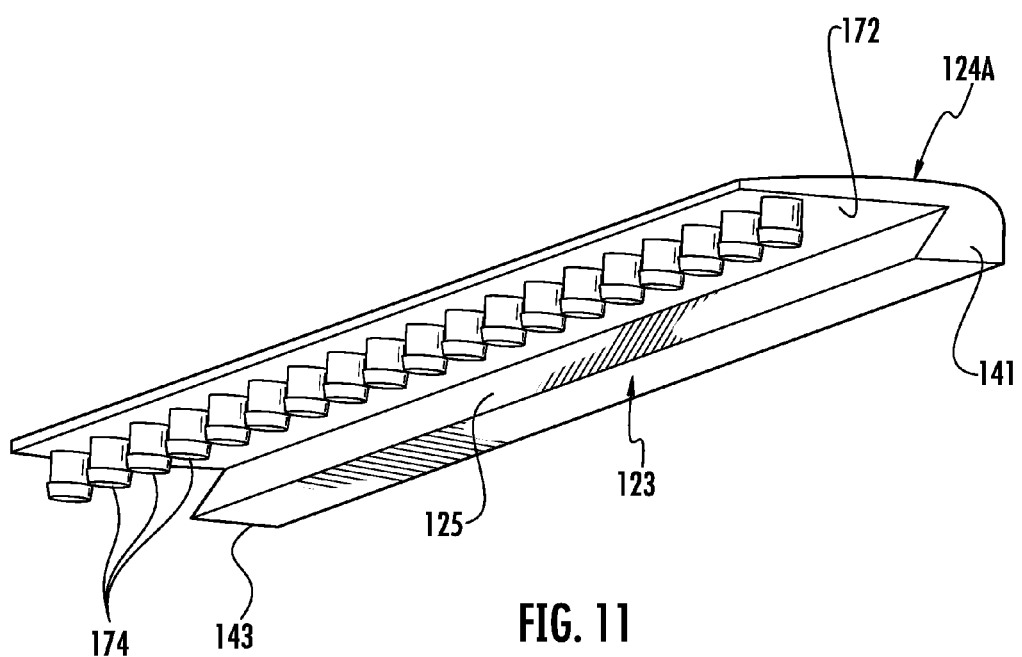
FIG. 11 is a perspective view of a cover member of the assembly of FIG. 2.
Figure 12:
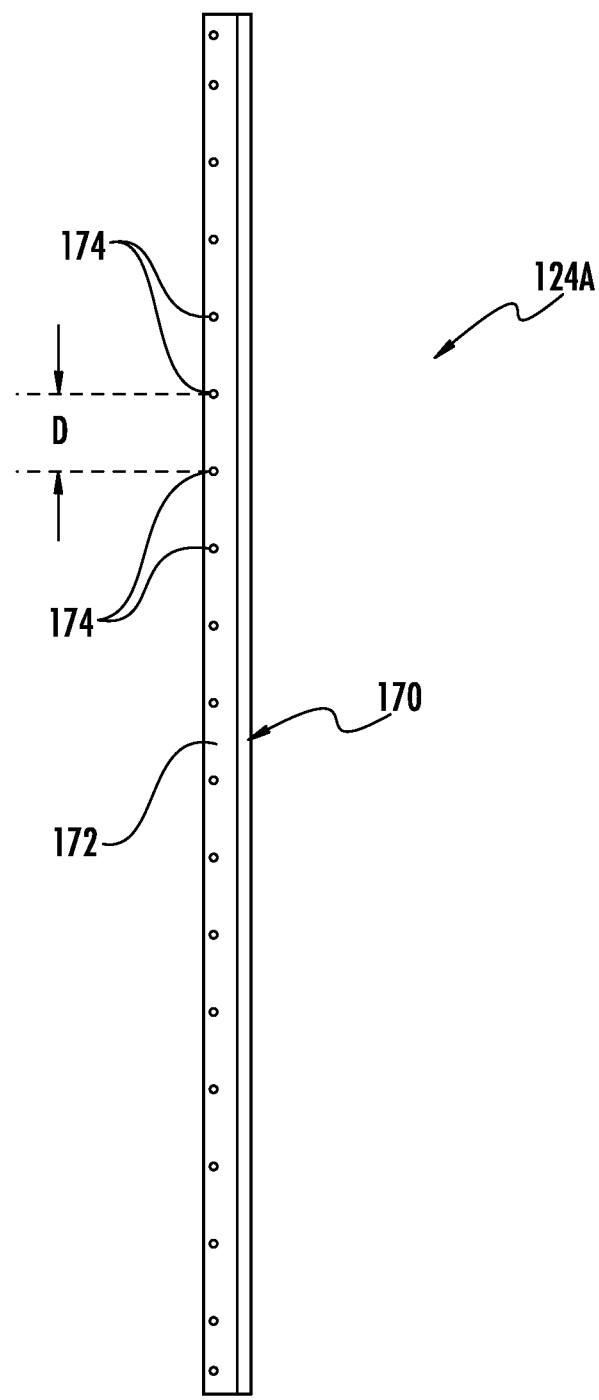
FIG. 12 is a bottom view thereof.

As shown in FIGS. 7-8, each male post 144 has an upper surface 148, a lower surface 150, and side post surfaces 152. As shown in FIG. 8, each female socket 146 has an upper socket surface 154, a lower socket surface 156, and side socket surfaces 158. As shown in FIG. 10, when a male post 144 is received in a female socket 146, the lower post surface 150 and the upper post surface 148 are in adjacent facing relation with the lower female socket surface 156 and the upper female socket surface 154, respectively. This provides a snug, friction fit between the respective male post 144 and the respective female socket 146. Thus, when a user assembles the four base members 122A-D to form the base, the base members are biased to remain in assembled relation during the rest of the assembly process, which includes the subsequent steps of placing the stencil on the base and securing the stencil between the base members 122A-D and the cover members 124A-D. The base members 122A-D can also be held together by an adhesive or another fastener.

When the base members 122A-D are in assembled relation to form a base, the side post surfaces 152 of a male post 144 on a first base member are in facing relation with the respective side socket surfaces 158 of the respective female socket 146 of a second base member. As shown in FIG. 10, in the preferred embodiment, there is a gap between at least one of the side post surfaces 152 and the respective side socket surface 158. In the cross-section shown, there are gaps between both side post surfaces 152 and the respective side socket surfaces 158. This allows for some relative movement of the base members 122A-D during assembly.

Each base member 122A-D has a top surface 160 that provides a support surface for supporting a peripheral portion of a stencil foil 114. In the preferred embodiment, the upper surface 160 of each base member 122A-D is located in the middle portion of the base member and defines a substantially planar surface. The upper surface 160 of the base member 122A-D defines a plurality of base apertures 164 in this middle portion. The base apertures 164 extend from the upper surface 160 of the base member to the bottom surface 162 of the base member. The base apertures 164 are spaced apart, and they are each configured and arranged to be in alignment with a respective one of the stencil foil apertures 126 when the stencil is supported on the base.

Once a user aligns the stencil apertures 126 with the base apertures 164, the user secures the stencil foil 144 between a cover and the base, by individually securing each cover member 124A-D to its respective base member 122A-D. The cover member, shown in FIGS. 11-12, includes four cover members 124A-D, each configured to be received by one of the base members 122A-D. Each cover member has a main body 170 having a lower surface 172 for engaging the stencil 114. A plurality of snap posts 174 depend downwardly from the lower surface 172 of the cover member, and are spaced apart by the same distance D as the apertures in the stencil 114. The snap posts 174 are configured to be respectively routed through the stencil apertures 126, and are configured to be in secured engagement with the base apertures 164. When the cover member 124A-D is secured to the respective base member 122A-D, the stencil foil 114 is sandwiched between the cover member and the base member, so the stencil foil is held in frictional engagement between the upper surface 160 of the base member and the lower surface 172 of the cover member, for each pair of cover member 124A-D and base member 122A-D around the peripheral edge of the stencil foil.

Figure 13:
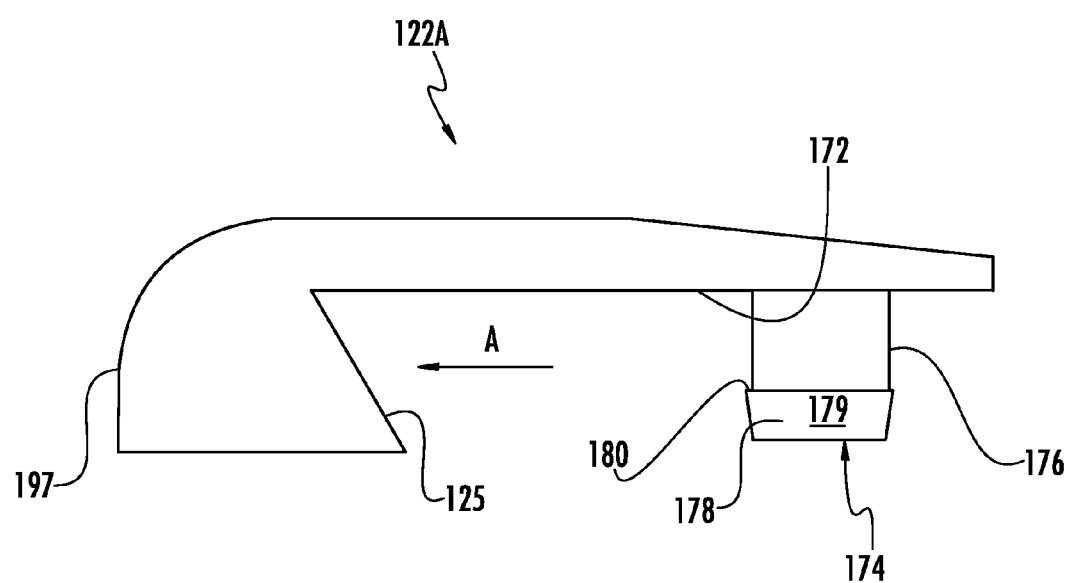
FIG. 13 is a side view thereof.

As shown in FIG. 13, each snap post 174 has a post wall 176 that extends downwardly from the lower surface 172 of the cover member 124A. In the preferred embodiment, the post wall 176 is substantially cylindrical. A tapered latching formation 178 is formed at the lower end of the post wall. This tapered latching formation has a tapered annular outer wall 179. An annular latching face 180 extends between the post wall 176 and the tapered outer wall 179. The latching face 180 extends along a plane that is substantially perpendicular to the longitudinal axis of the snap post 176, so that a substantially right angle is formed between the post wall 176 and the annular latching face 180.

Figure 14:
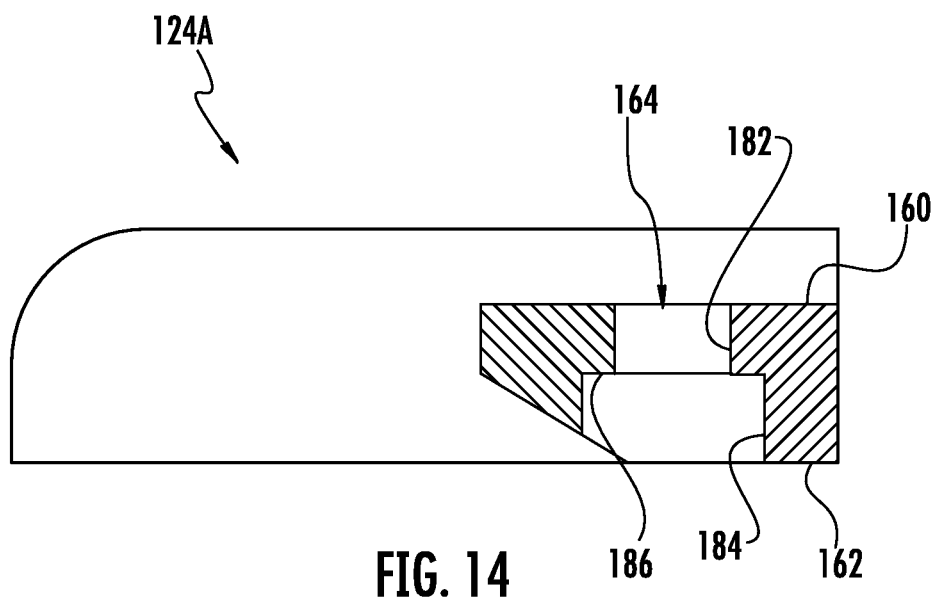
FIG. 14 is a cross-sectional view of the base member of FIG. 6, showing an aperture defined in the base.

The apertures 164 in the base member, shown in FIG. 14, are configured for receiving the snap posts 174. Additionally, the apertures 164 on the base members and the snap posts 174 on the cover members are respectively configured and arranged to secure the cover members 124A-D to the respective base members 122A-D. Preferably, the snap posts 174 and apertures 164 allow for a substantially permanent or permanent connection between a respective pair of a cover member and a base member. This allows a user to assemble a base and a cover around a stencil foil 114, and to have a stencil foil assembly 100 that substantially permanently or permanently secures a stencil foil 114 thereon. Thus, the stencil foil assembly does not easily come apart during use or storage. This allows a user to handle the stencil frame safely and to store the stencil frame safely for future use.

To provide this secure connection, each base aperture 164 includes an annular base aperture wall 182, a recessed aperture wall 184, and an annular post retention face 186 that extends between the annular base aperture wall 182 and the recessed annular wall 184. The annular post retention face 186 is configured to engage the annular latching face 180 of a respective snap post 174 for retaining the respective snap post 174 within the aperture 164.

Figure 15:
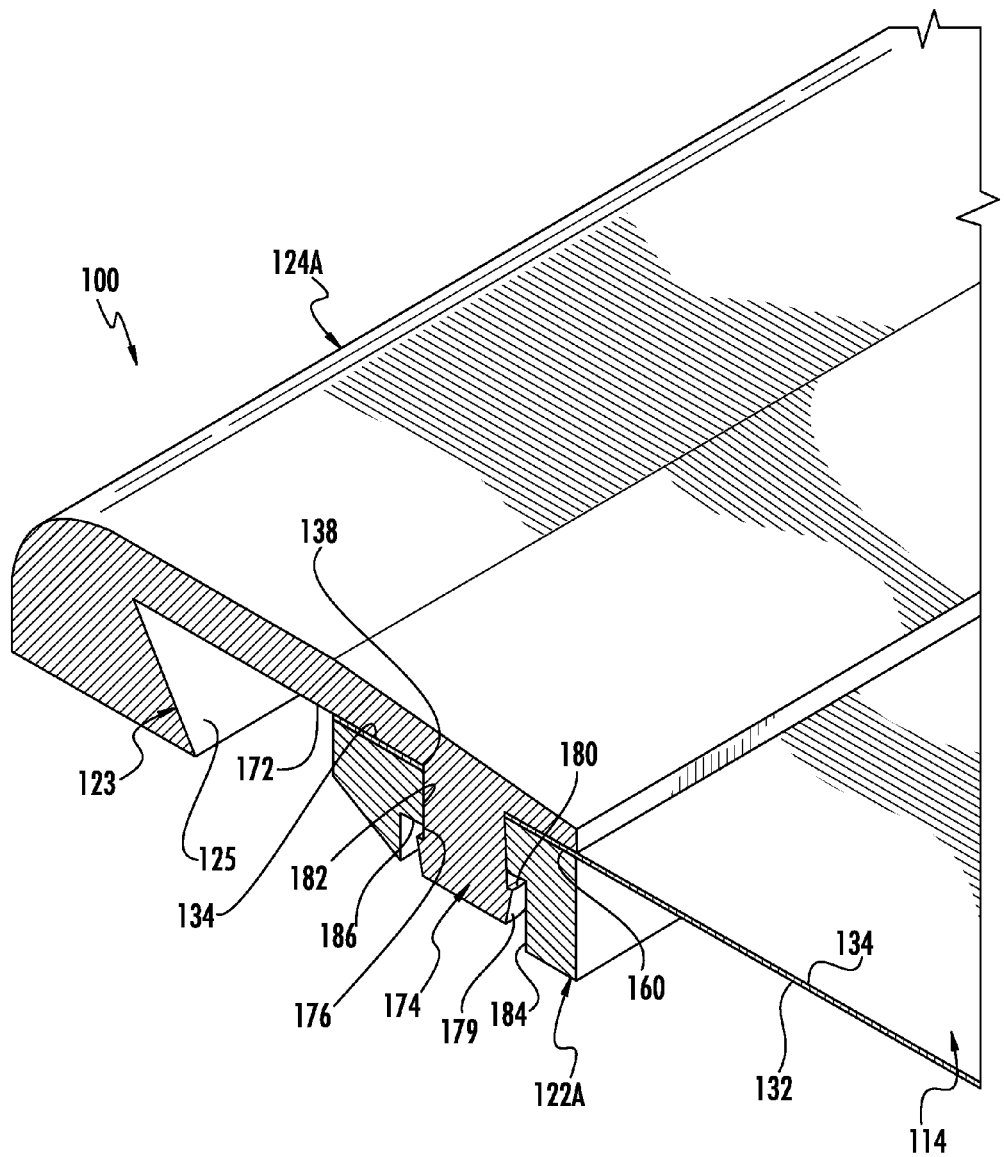
FIG. 15 is a perspective cross-sectional view of the assembly of FIG. 2.
Figure 16:
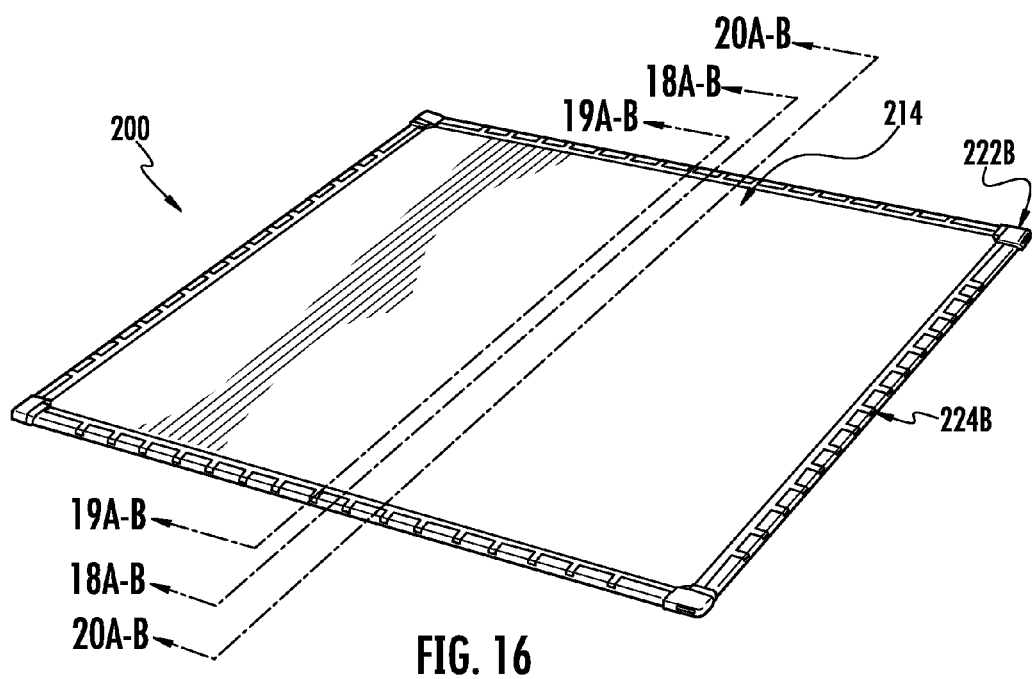
FIG. 16 is perspective view of the stencil foil assembly of a second embodiment of the present invention with base and cover installed on the stencil foil in accordance with the present invention.
Figure 17A:
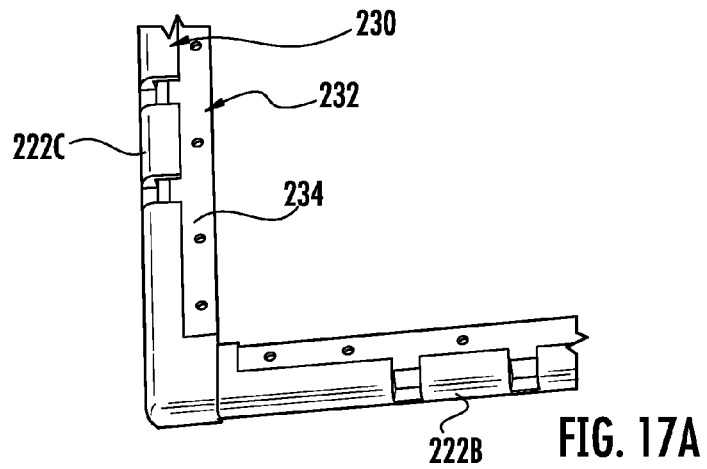
FIGS. 17A-17C show the process of installing the base and cover to a stencil foil for the assembly of FIG. 16.
Figure 17B:
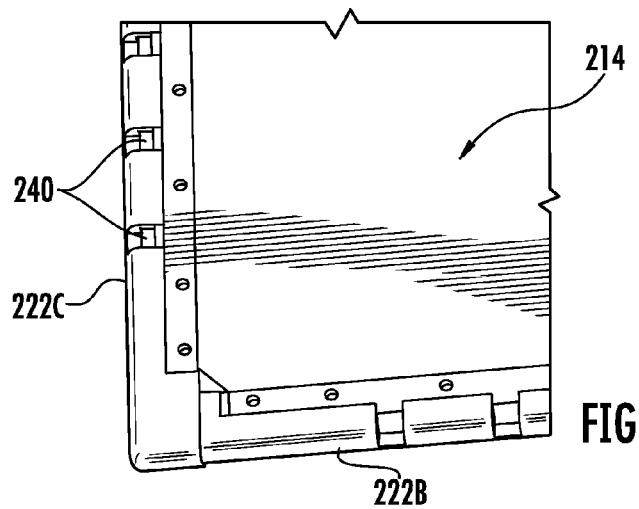
Figure 17C:
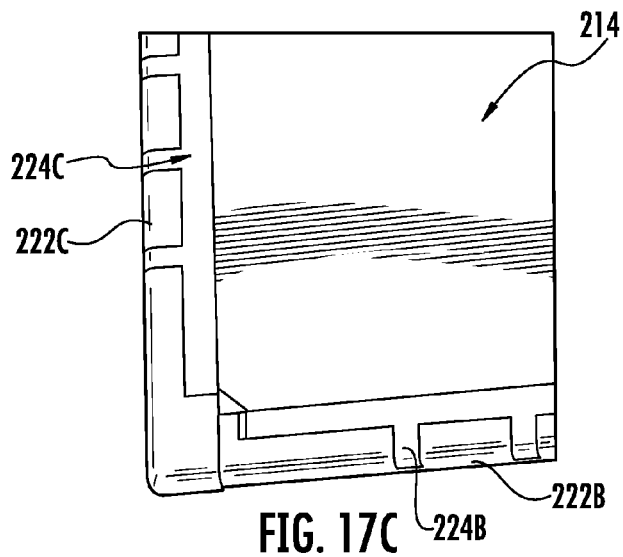

The cross-sectional view of FIG. 15 shows how the stencil is supported and gripped by the cover member 124A and the base member 122A along peripheral edge 128A of the stencil foil. The lower surface 172 of the cover member 124A engages the upper surface 134 of the stencil. The upper surface 160 of the base member 122A engages the lower surface 132 of the stencil foil 114. The posts of the cover member are received in the apertures of the base member. The latching face 180 of the post 172 is in facing relation with the retention face 186 of the base member aperture 164. The outer wall 176 of the post 172 extends through the stencil aperture 126, and the post's outer wall 176 extends past the inner wall 138 of the stencil aperture 126. The frictional engagement of the stencil foil 114 with the base member 122A and cover member 124A helps to transfer the load from the cover member 124A to the stencil foil 114. Thus, when the cover member 124A is pulled away from the center region 130 of the stencil foil 114, the peripheral region 128A of the stencil foil 114 is pulled away from the center region 130 of the stencil foil 114.

The stencil foil assembly 100 also includes a stretching machine engagement member (or an engagement member) 123 that is configured to engage a stretch frame apparatus (not shown). In the preferred embodiment, an engagement member 123 is integrally formed on each cover member 124A-D. Each engagement member 123 is an inwardly sloped cover grip surface (or engagement surface) 125 that is formed adjacent to the lower surface of the cover member 124A-D. An engagement member 123 extension depends downwardly from the main body of the cover member 124A-D. When the stencil foil assembly 100 is mounted on a stretching machine (not shown), the stretching machine engages the cover grip surface 125 to pull the assembly and the stencil foil in tension, away from the center of the stencil foil. When the stencil foil assembly 100 of the preferred embodiment is mounted on the stretching machine, the cover members are pulled in tension outwardly, away from the center region 130 of the stencil foil 114, substantially along the arrow A in FIG. 13. As described above, the cover members are secured to the base members around a peripheral edge of the stencil foil 114. Thus, the outwardly directed tension on the cover members results in a tension on the stencil foil and the base members, so that the stencil foil is pulled away from the stencil's center region 130 towards the peripheral outer edges 128A-D.

Returning now to FIGS. 6-11, which show the male post and female socket formations, the male post 144 extends horizontally outwardly from a male post platform 190. The male post platform extends upwardly and outwardly from the upper surface 160 of the middle portion of the base member. The male post platform 190 has a proximal platform surface 191, a distal platform surface 192, and an upper surface 193. The proximal and distal platform surfaces are on opposite sides of the platform. The upper surface 160 of the middle portion of the base member extends from the proximal platform surface 191, while the male post extends from the distal platform surface 193.

At the other end of the base member 122A-D, a female socket housing 164 provides a housing in which the female socket is defined. The female socket housing 164 has a proximal housing surface 194 and a distal housing surface 195. The upper surface 160 of the middle portion of the base member 122A-D extends from the proximal housing surface 194. Thus, the middle portion of the base member extends between the proximal housing surface 194 and the proximal post platform surface 191 on the base member. The female socket housing extends upwardly and outwardly from the middle portion of the base member.

Each cover member 124A-D has a first end surface 141 at its first end, and a second end surface 143 at its second end. The cover member 124A-D is dimensioned and configured so the first end surface 141 of the cover is in facing relation with the proximal platform surface 191, and the second end surface 143 of the cover is in facing relation with the proximal socket housing surface 194 when the cover member 122A-D and the base member 124A-D are secured in assembled relation.

When the stencil foil kit is fully assembled to form a stencil foil assembly, the outer peripheral edge of the stencil foil assembly (or stencil foil assembly peripheral edge) is formed by the outer geometry of the female socket housings 146, the post platforms 190, and the outer peripheral cover edge 197 that is defined on each cover member 122A-D. Due to the dimensions and configuration of the cover members and the base members, the outer peripheral edge of the stencil foil assembly is substantially continuous.

In the embodiment shown herein, the female socket extends from one side of the female socket housing 146 to the other, so that there is an open end of the female socket on the outer peripheral face of the female socket housing 146. However, in an embodiment not shown, the female socket housing is configured to have female socket that does not fully extend through the female socket housing, and thus only has one opening on the female socket housing.

FIGS. 16-22B show a second embodiment of the present invention. In the second embodiment 200, each base member 222A-D has an upstanding wall 230, and a flange 232 emanates inwardly from the upstanding wall 230. The support flange 232 has a top flange surface 234 that forms at least a part of the top surface of the base member for supporting the stencil foil 214 thereon. FIGS. 17A-B show the stencil foil 214 can be placed on the top flange surface 234.

A plurality of notches 240 are defined along a length of each base member 222A-D. Each cover member 224A-D further includes a plurality of fingers 242. Each finger 242 extends from the main body 244 of the cover, and each finger 242 is configured to align with a respective notch 240 along the length of the base.

Each finger 242 has an inner surface 246. Each base member 222A-D has a reverse cut flange 248 that is adjacent to the notches. Together, the inner surface 246 of the fingers 242 and the inner surface of the reverse cut flange 248 of the base together form a grip surface (an engagement surface) for engaging a stretching machine (not shown). Thus, in the second embodiment, an engagement member is formed by surfaces on the base member and the cover member. In this embodiment, the tension of the stretching machine is transferred directly to the cover member and the base member.

Figure 18A:
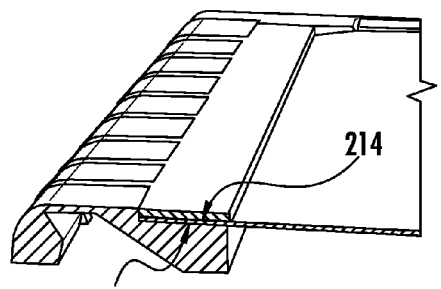
FIGS. 18A and 18B are cross-sectional views through the line 318-318 of FIG. 16.
Figure 18B:
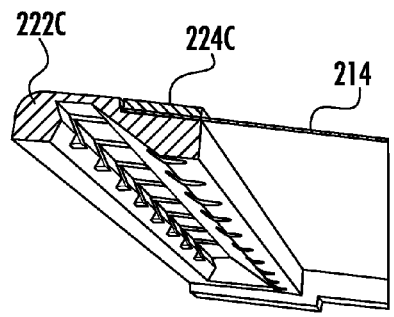
Figure 19A:
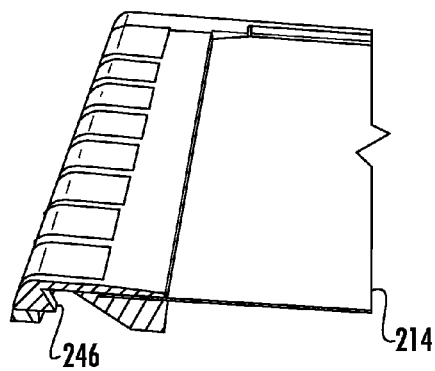
FIGS. 19A and 19B are cross-sectional views through the line 319-319 of FIG. 16.
Figure 19B:
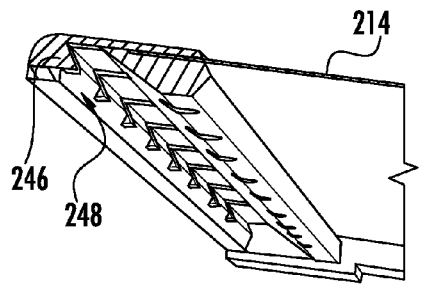
Figure 20A:
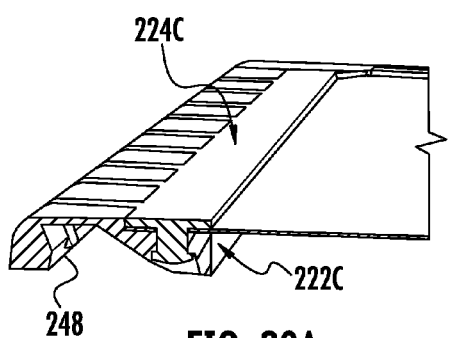
FIGS. 20A and 20B are cross-sectional views through the line 320-320 of FIG. 16.
Figure 20B:
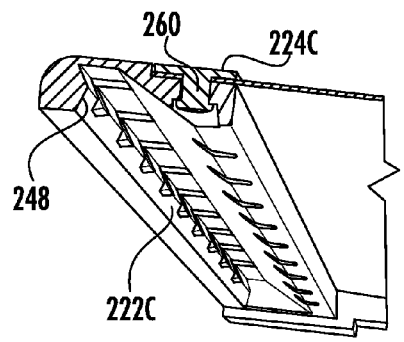
Figure 21:
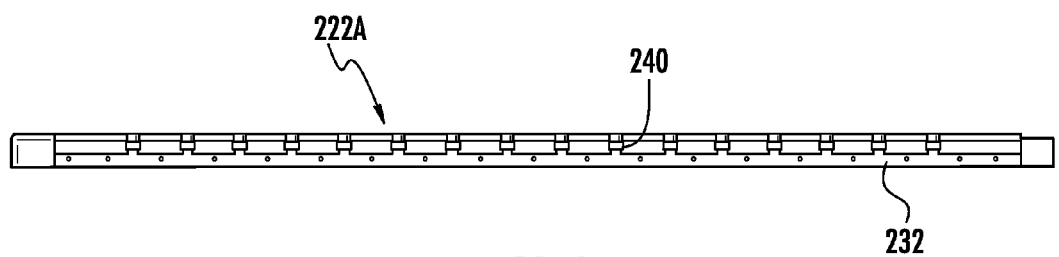
FIG. 21 is a top view of the base used in the assembly of the present invention.
Figure 22A:
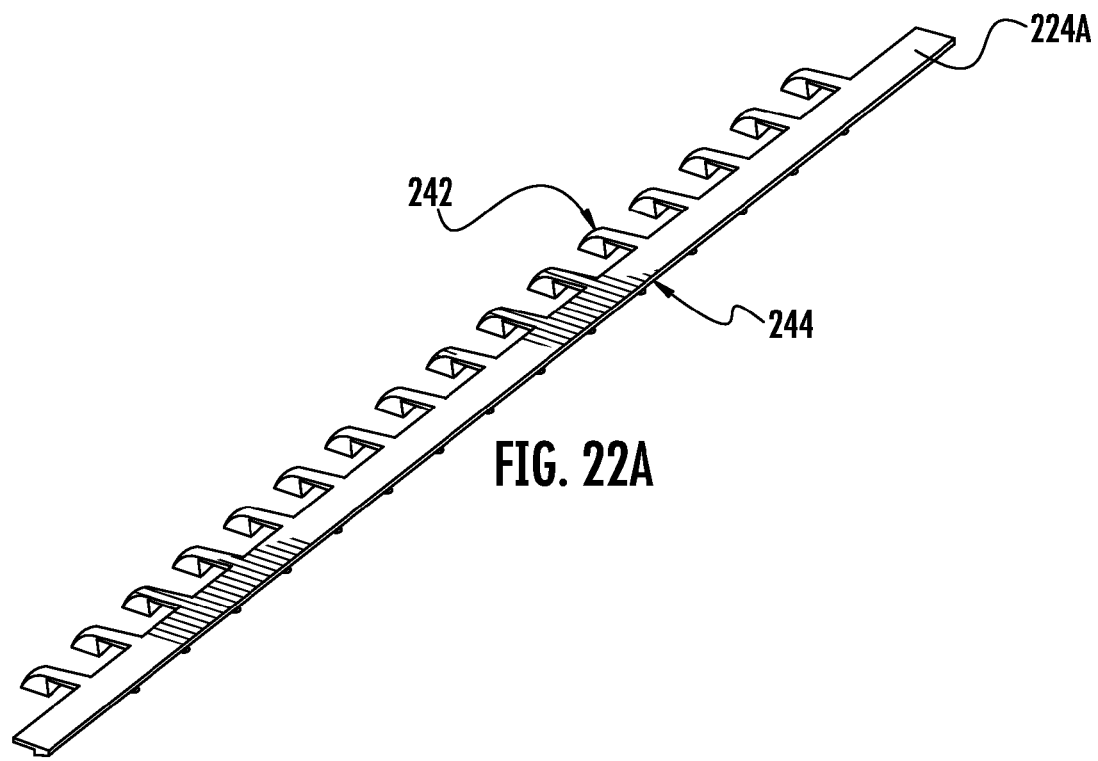
FIGS. 22A-22B are different views of the cover used in the assembly of the present invention.
Figure 22B:
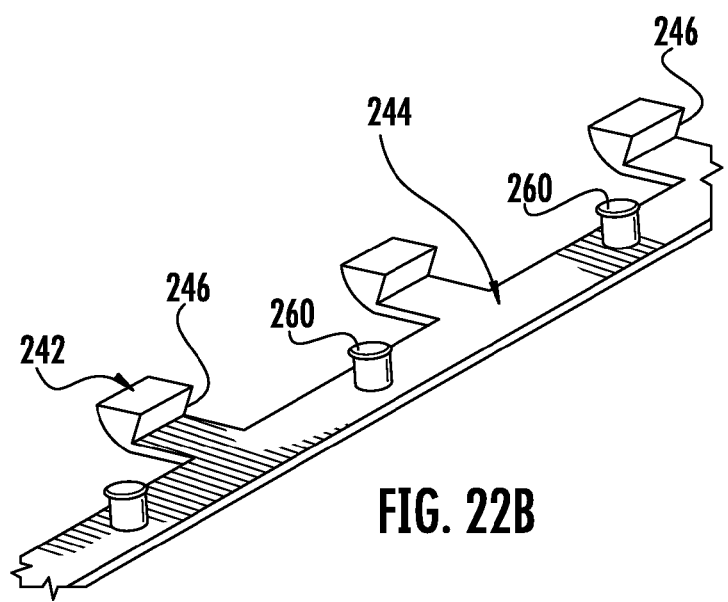

FIGS. 18A and 18B show a cross-sectional view that is not through a finger or a snap post to further illustrate the interconnection of the base and cover. In FIGS. 19A and 19B, a cross-sectional view through one of the fingers 242 is shown to illustrate how the fingers 242 also provide a reverse flange for engaging with a stretch frame apparatus. FIGS. 20A and 20B show that the second embodiment has a snap post 260 construction, like the preferred embodiment, to secure the cover members 224A-D to the respective base members 222A-D.

With the base members 222A-D and cover members 224A-D secured to the periphery of the stencil foil 214, the peripheral regions or edges of the stencil foil 214 are protected and a grip surface (or engagement surface) is now provided by the reverse cut flange provided by the bottom of the base and the free ends of the fingers in cooperation with each other. Most notably, as seen in FIGS. 18B, 19B and 20B, a reverse cut flange is provided by the bottoms of the fingers and cover to provide a reverse cut groove running the length of, preferably, each of the four sides of the assembly of the present invention. As can be understood, such as reverse cut groove can be used to secure the assembly, with stencil foil captured therein, to a stretching frame. In this example, the stretching machine at hand (not shown), includes a complementary member that moves outwardly to carry out the stretching operation to prepare the stencil foil for printing. Thus, the present invention enables such a stretching frame to be used with a standard stencil foil that does not have such a gripping structure by adapting a standard stencil frame for use with such a machine. It should be understood that the underside or other portion of the assembly can be modified to accommodate other stretching machines and other structures so that a stencil foil equipped with the present invention can be stretched and used thereon for printing.

It should be understood that the stencil foil in the figures is not shown with a desired array of holes for screen/stencil printing therethrough. However, any stencil pattern may be employed on a stencil for use with the assembly with the present invention. Also, is preferred that the base is preferably aluminum while the covers are preferably plastic. However, any type of material may be used and still be within the scope of the present invention.

In view of the foregoing, the stencil foil assembly of the present invention enjoys significant advantages over prior art assemblies. The present invention obviates the need for custom stencil foils to enable use in many types of stretch frames. A standard stencil foil can be adapted over for use in such stretch frames. This greatly reduces the cost of the manufacture of stencil foils.

It would be appreciated by those skilled in the art that various changes and modifications can be made to the illustrated embodiments without departing from the spirit of the present invention. All such modifications and changes are intended to be covered by the appended claims.

What is claimed is:

1. A stencil foil assembly for holding a stencil foil, the stencil foil having exposed edges of a peripheral portion with a plurality of stencil apertures along the exposed edges, the stencil foil assembly comprising:
    a plurality of base members, each of the base members having a top surface providing a support for a stencil foil about a peripheral portion of the stencil foil; each of the base members respectively defining a plurality of base apertures in the top surface, each base aperture being arranged to be in alignment with a respective one of the stencil apertures when the stencil is supported on the base members;
    a plurality of cover members, each cover member mating with a respective one of the base members, the cover further comprising a main body having a lower surface for engaging a stencil, the main body having a plurality of snap posts emanating from the lower surface; the snap posts being fixed to the lower surface and in spaced apart relation to each other on the lower surface; the snap posts configured to be respectively routed through the stencil apertures and in secured engagement with the base apertures, to sandwich a peripheral portion of the stencil foil between the top surface of the respective base members and the lower surface of the respective cover members;
    each base member having a first end and a second end, a male post located at the first end, and a female socket defined in a female socket housing located at the second end, whereby the male post of one of the base members is received in the female socket of an adjacent one of the base members when the base members are assembled to form the base of the stencil foil assembly;
    a male post platform defined on each base member, the male post extending from the male post platform, the male post platform having a proximal platform surface and a distal platform surface opposite the proximal platform surface, the male post extending from the distal platform surface;
    the female socket housing having a proximal housing surface and a distal housing surface opposite the proximal housing surface;
    the respective cover member having a first end surface at a first end of the respective cover member and a second end surface at a second end of the respective cover member, the respective cover member being dimensioned and configured so the first end surface of the respective cover member is in facing relation with the proximal platform surface and the second end surface of the respective cover member is in facing relation with the proximal housing surface when the respective cover member is secured to the respective base member;
    wherein the plurality of base members is equal in number to the plurality of cover members; and
    an engagement member secured to one of the cover and the base members, the engagement member being configured to interconnect to a stretch frame apparatus.

2. The stencil foil assembly of claim 1, wherein each base member further comprises an upstanding wall, and a flange emanating inwardly from the upstanding wall, said support flange having a top flange surface that forms at least a part of the top surface of each base member for supporting the stencil.

3. The stencil foil assembly of claim 2,
    wherein a plurality of notches are defined along a length of each base member;
    wherein each cover member further comprises a plurality of fingers, each finger extending from the main body thereof, and each finger being configured to align with a respective notch along the length of each respective base member.

4. The stencil foil assembly of claim 3,
    wherein each finger has an inner surface;
    wherein each base member has a reverse cut flange adjacent the notches; and
    wherein the inner surfaces of the fingers and the reverse cut flange of the base members together form a grip surface for engaging a stretching machine.

5. The stencil foil assembly of claim 1,
    wherein the engagement member is integrally formed with at least one of the cover members; and
    wherein the engagement member is an inwardly sloped cover grip surface formed adjacent the lower surface of at one of the cover members.

6. The stencil foil assembly of claim 1, wherein each snap post further comprises:
    a post wall extending from the lower surface of the cover, the post wall being substantially cylindrical;
    a tapered latching formation formed at a lower end of the post wall, the tapered latching formation having a tapered annular outer wall and an annular latching face extending between the post wall and the tapered annular outer wall.

7. The stencil foil assembly of claim 6, wherein each base aperture further comprises:
    an annular base aperture wall;
    a recessed annular wall;
    an annular post retention face extending between the annular base aperture wall and the recessed annular wall, the annular post retention face being configured to engage the annular latching face of a respective snap post for retaining the respective snap post within the aperture.

8. The stencil foil assembly of claim 1, wherein the plurality of base members is four base members, and the plurality of cover members is four cover members.

9. The stencil foil assembly of claim 1,
    each male post further comprising an upper surface and a lower surface;
    each female socket further comprising an upper socket surface and a lower socket surface;
    each male post and each female socket being configured and arranged so the upper surface of the male post is in adjacent facing relation with the upper female socket surface and so the lower surface of the male post is in adjacent facing relation with the lower female socket surface when a respective male post of a first one of the base members is received in a respective female socket of an adjacent one of the base members, thereby providing a snug, friction fit between the respective male post and the respective female socket.

10. The stencil foil assembly of claim 1,
    each male post further comprising side post surfaces;
    each female socket further comprising side socket surfaces;

the side post surfaces being in facing relation with the respective side socket surfaces when a respective male post is received in a respective female socket.

\* \* \* \* \*